United States Patent
Hustad et al.

(10) Patent No.: US 9,910,353 B2
(45) Date of Patent: Mar. 6, 2018

(54) METHOD OF NEGATIVE TONE DEVELOPMENT USING A COPOLYMER MULTILAYER ELECTROLYTE AND ARTICLES MADE THEREFROM

(71) Applicants: Dow Global Technologies LLC, Midland, MI (US); ROHM AND HAAS ELECTRONIC MATERIALS LLC, Marlborough, MA (US)

(72) Inventors: Phillip D. Hustad, Midland, MI (US); Jong Park, Marlborough, MA (US); Jieqian Zhang, Marlborough, MA (US); Vipul Jain, Marlborough, MA (US); Jin Wuk Sung, Marlborough, MA (US)

(73) Assignees: DOW GLOBAL TECHNOLOGIES LLC, Midland, MI (US); ROHM AND HAAS ELECTRONIC MATERIALS LLC, Marlborough, MA (US)

(*) Notice: Subject to any disclaimer, the term of this patent is extended or adjusted under 35 U.S.C. 154(b) by 0 days.

(21) Appl. No.: 15/223,822

(22) Filed: Jul. 29, 2016

(65) Prior Publication Data
US 2018/0031971 A1 Feb. 1, 2018

(51) Int. Cl.
*G03F 7/004* (2006.01)
*G03F 7/09* (2006.01)
(Continued)

(52) U.S. Cl.
CPC ............ *G03F 7/094* (2013.01); *C08F 293/00* (2013.01); *C08F 293/005* (2013.01);
(Continued)

(58) Field of Classification Search
CPC .......... G03F 7/002; G03F 7/165; G03F 7/168; G03F 7/20; G03F 7/40; H01L 21/0274; C09D 153/00; C08F 293/00
(Continued)

(56) References Cited

U.S. PATENT DOCUMENTS

2012/0094087 A1* 4/2012 Millward ............... B82Y 30/00
428/188
2012/0318741 A1 12/2012 Peinemann et al.
(Continued)

OTHER PUBLICATIONS

Addison et al.; "Multi-layer films of block copolymer micelles adsorbed to colloidal templates"; Phil. Trans. R. Soc. A; vol. 368; 2010, pp. 4293-4311.
(Continued)

*Primary Examiner* — Amanda C Walke
(74) *Attorney, Agent, or Firm* — Cantor Colburn LLP

(57) ABSTRACT

Disclosed herein is a multi-layered article, comprising a substrate; and two or more layers disposed over the substrate, wherein each said layer comprises a block copolymer comprising a first block and a second block, wherein the first block comprises a repeat unit containing a hydrogen acceptor or a hydrogen donor, and the second block comprises a repeat unit containing a hydrogen donor when the repeat unit of the first block contains a hydrogen acceptor, or a hydrogen acceptor when the repeat unit of the first block contains a hydrogen donor; wherein the first block of an innermost of said two or more layers is bonded to the substrate, and the first block of each layer disposed over the innermost layer is bonded to the second block of a respective underlying layer; and wherein the hydrogen donor or hydrogen acceptor of the second block of an outermost said two or more layers is blocked.

10 Claims, 2 Drawing Sheets

(51) Int. Cl.
  *G03F 7/038* (2006.01)
  *C08F 293/00* (2006.01)
  *G03F 7/16* (2006.01)
  *G03F 7/20* (2006.01)
  *G03F 7/32* (2006.01)
  *H01L 21/308* (2006.01)
  *G03F 7/40* (2006.01)
  *H01L 21/027* (2006.01)
  *C09D 153/00* (2006.01)

(52) U.S. Cl.
  CPC ......... *C09D 153/00* (2013.01); *G03F 7/0382* (2013.01); *G03F 7/16* (2013.01); *G03F 7/165* (2013.01); *G03F 7/168* (2013.01); *G03F 7/20* (2013.01); *G03F 7/325* (2013.01); *G03F 7/40* (2013.01); *H01L 21/0274* (2013.01); *H01L 21/3081* (2013.01)

(58) Field of Classification Search
  USPC ............ 430/270.1, 322, 325, 329, 330, 331; 525/450, 540; 524/251
  See application file for complete search history.

(56) References Cited

U.S. PATENT DOCUMENTS

| | | | |
|---|---|---|---|
| 2013/0231438 A1* | 9/2013 | Kim | B82Y 10/00 524/500 |
| 2015/0072536 A1 | 3/2015 | Muramatsu et al. | |
| 2015/0228475 A1* | 8/2015 | Ban | H01L 21/0337 216/49 |
| 2016/0004163 A1* | 1/2016 | Blakey | G03F 7/0002 430/17 |
| 2016/0033869 A1 | 2/2016 | Hustad et al. | |
| 2016/0357109 A1* | 12/2016 | Jain | G03F 7/405 |
| 2016/0357110 A1* | 12/2016 | Zhou | G03F 7/002 |
| 2016/0357111 A1* | 12/2016 | Jain | G03F 7/40 |
| 2016/0357112 A1* | 12/2016 | Jain | G03F 7/168 |

OTHER PUBLICATIONS

Choi et al.; "Selective Adsorption of Amphiphilic Block Copolymers on Weak Polyelectrolyte Multilayers"; J. Macromol. Sci.—Pure Appl. Chem.; A38(12); 2001, pp. 1191-1206.
Chuang et al.; "Using Directed Self Assembly of Block Copolymer Nanostructures to Modulate Nanoscale Surface Roughness: Towards a Novel Lithographic Process"; Adv. Funct. Mater.; vol. 23; 2013, pp. 173-183.
Creutz et al.; "Living Anionic Homopolymerization and Block Copolymerization of (Dimethylamino)ethyl Methacrylate"; Macromolecules; vol. 30; 1997, pp. 6-9.
Decher; "Fuzzy Nanoassemblies: Toward Layered Polymeric Multicomposites"; Science; vol. 277; Aug. 29, 1997; 6 pages.
Giebeler et al.; "ABC triblock polyampholytes containing a neutral hydrophobic block, a polyacid and a polybase"; Macromol. Chem. Phys.; vol. 198; 1997, pp. 3815-3825.
Joseph et al.; "Layer-by-layer preparation of polyelectrolyte multilayer membranes for separation"; Polym. Chem.; vol. 5; 2014; pp. 1817-1831.
Lowe et al.; "Synthesis and Characterization of Zwitterionic Block Copolymers"; Macromolecules; vol. 31; 1998, pp. 5991-5998.
Lowe et al.; "Synthesis and Solution Properties of Zwitterionic Polymers"; Chem. Rev.; vol. 102; 2002, pp. 4177-4189.
Qi et al.; "Layer-by-Layer Assembly of Two Different Polymer Micelles with Polycation and Polyanion Coronas"; Macromolecules; vol. 39; 2006; pp. 5714-5719.
Seon; "Polyelectrolyte Multilayers: A Versatile Tool for Preparing Antimicrobial Coatings"; Langmuir; vol. 31; 2015; pp. 12856-12872.
Tan et al.; "Temperature-Induced, Reversible Swelling Transitions in Multilayers of a Cationic Triblock Copolymer and a Polyacid"; Macromolecules; vol. 43; 2010, pp. 1950-1957.
Xiao et al.; "Planar Multilayer Assemblies Containing Block Copolymer Aggregates"; Langmuir; vol. 30; 2014; pp. 891-899.

* cited by examiner

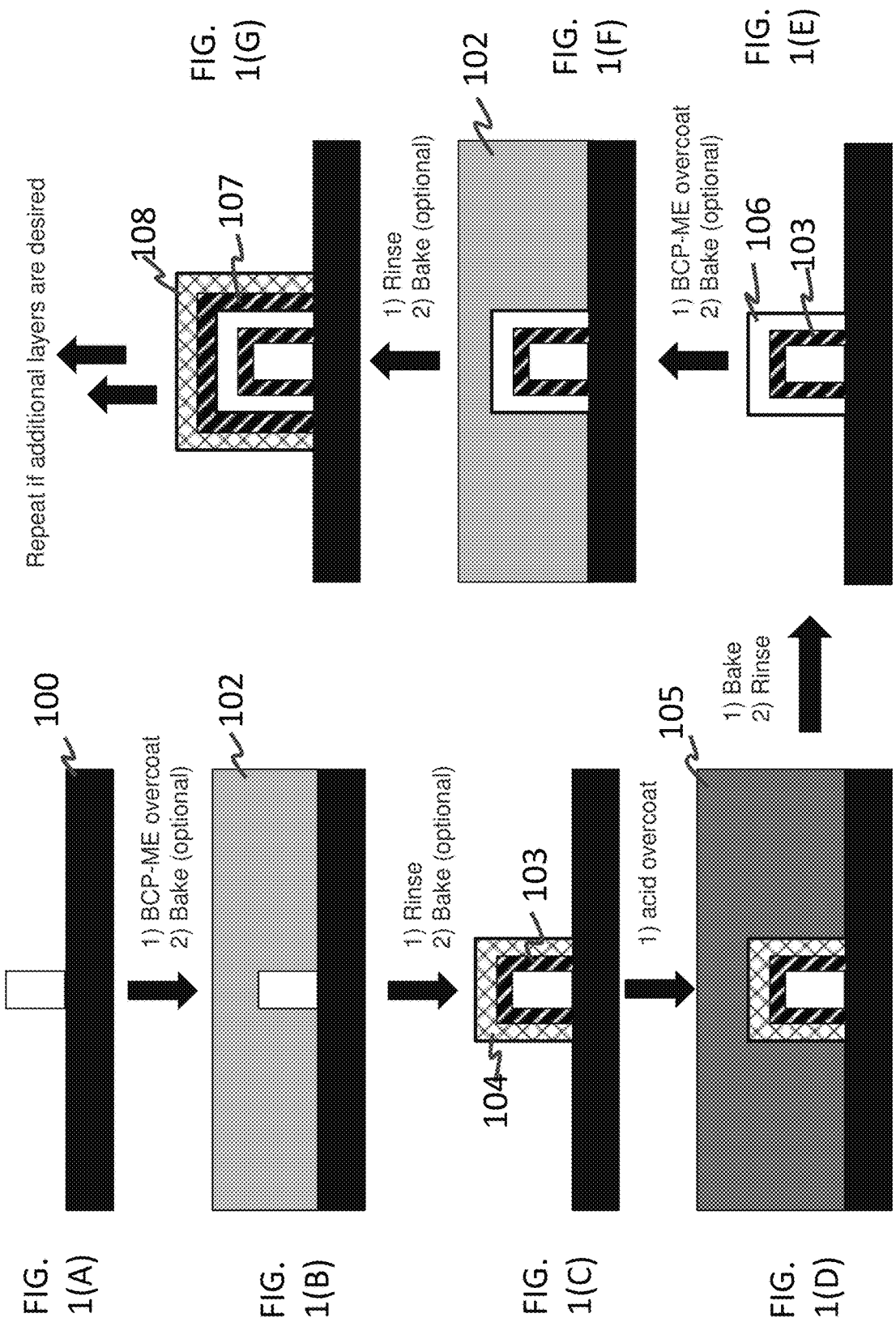

Example 9
After second treatment with
PDMAEMA-b-P(ADMA-r-PPMA)
$CD_3 = 41$ nm
$\Delta CD_b = 19$ nm
$\Delta\Delta CD = 5$ nm Example 8
After treatment with PDMAEMA-b-P(ADMA-r-PPMA)
$CD_2 = 46$ nm
$\Delta CD_a = 14$ nm Example 7
NTD resist pattern without treatment with block copolymer
$CD_1 = 60$ nm

METHOD OF NEGATIVE TONE DEVELOPMENT USING A COPOLYMER MULTILAYER ELECTROLYTE AND ARTICLES MADE THEREFROM

BACKGROUND

This disclosure relates to a method of negative tone development using a copolymer multilayer electrolyte and to articles made therefrom. In particular, this disclosure relates to a method of negative tone development shrink using a block copolymer multilayer electrolyte and to articles made therefrom.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing using a positive tone development (PTD) process. In the PTD process, exposed regions of a photoresist layer are soluble in a developer solution, typically an aqueous alkaline developer, and are removed from the substrate surface, whereas unexposed regions which are insoluble in the developer remain after development to form a positive image. To improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer.

Considerable effort has been made to extend the practical resolution beyond that achieved with positive tone development from both a materials and processing standpoint. One such example is the negative tone development (NTD) process. The NTD process allows for improved resolution and process window as compared with standard positive tone imaging by making use of the superior imaging quality obtained with bright field masks for printing critical dark field layers. NTD resists typically employ a resin having acid-labile (also referred to herein as acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by organic solvent developers, leaving behind a pattern created by the insoluble exposed regions.

To further extend resolution capabilities beyond those typically obtained with standard resist patterning techniques, various processes for pattern shrink have been proposed. These processes involve increasing the effective thickness of the resist pattern sidewalls to reduce (i.e., "shrink") the spacing, for example, between adjacent lines or within a trench or hole pattern. In this way, features such as trenches and contact holes formed from the patterns can be made smaller. Known shrink techniques include, for example, chemical vapor deposition (CVD) assist, acid diffusion resist growth and polymer blend self-assembly.

The CVD assist shrink process (see K. Oyama et al, "The enhanced photoresist shrink process technique toward 22 nm node", *Proc. SPIE* 7972, Advances in Resist Materials and Processing Technology XXVIII, 79722Q (2011)), uses a CVD-deposited layer formed over a photoresist pattern including, for example, contact hole, line/space or trench patterns. The CVD material is etched back, leaving the material on sidewalls of the resist pattern. This increases the effective lateral dimensions of the resist pattern, thereby reducing the open areas that expose the underlying layer to be etched. The CVD assist shrink technique requires use of CVD and etching tools which are costly, add to the complexity of the process and are disadvantageous in terms of process throughput.

In the acid diffusion resist growth process, also referred to as the RELACS process (see L. Peters, "Resists Join the Sub-λ, Revolution", *Semiconductor International,* 1999. 9), an acid-catalyzed crosslinkable material is coated over a PTD-generated resist patterned surface. Crosslinking of the material is catalyzed by an acid component present in the resist pattern that diffuses into the crosslinkable material during a baking step. The crosslinking takes place in the material in the vicinity of the resist pattern in the acid diffusion region to form a coating on sidewalls of the pattern, thereby reducing the lateral dimension of open areas of the pattern. This process typically suffers from iso-dense bias (IDB), wherein growth of the crosslinked layer on the resist pattern occurs non-uniformly across the die surface depending on density (spacing between) adjacent resist patterns. As a result, the extent of "shrink" for identical features can vary across die based on pattern density. This can lead to patterning defects and variations in electrical characteristics across the die for what are intended to be identical devices.

Polymer blend self-assembly (see Y. Namie et al, "Polymer blends for directed self-assembly", *Proc. SPIE* 8680, Alternative Lithographic Technologies V, 86801M (2013)) involves coating a composition containing an immiscible blend of hydrophilic and hydrophobic polymers over the photoresist pattern.

The composition is then annealed, causing the polymers to phase separate, wherein the hydrophilic polymer preferentially segregates to the resist pattern sidewalls and the hydrophobic polymer fills the remainder of the volume between the resist pattern sidewalls. The hydrophobic polymer is next removed by solvent development, leaving the hydrophilic polymer on the resist pattern sidewalls. Polymer blend self-assembly has been found to suffer from proximity and size effects. As the shrink ratio is determined by the volume ratio of the two polymers, all features shrink by the same relative percentage rather than by the same absolute amount. This can lead to the same problems described with respect to the acid diffusion resist growth technique.

There is a continuing need in the art for improved photoresist pattern shrink methods which address one or more problems associated with the state of the art and which allow for the formation of fine patterns in electronic device fabrication.

SUMMARY

Disclosed herein is a multi-layered article, comprising a substrate; and two or more layers disposed over the substrate, wherein each said layer comprises a block copolymer comprising a first block and a second block, wherein the first block comprises a repeat unit containing a hydrogen acceptor or a hydrogen donor, and the second block comprises a repeat unit containing a hydrogen donor when the repeat unit of the first block contains a hydrogen acceptor, or a hydrogen acceptor when the repeat unit of the first block contains a hydrogen donor; wherein the first block of an innermost of said two or more layers is bonded to the substrate, and the first block of each layer disposed over the innermost layer is bonded to the second block of a respective underlying layer; and wherein the hydrogen donor or hydrogen acceptor of the second block of an outermost said two or more layers is blocked.

BRIEF DESCRIPTION OF THE FIGURES

FIG. 1(A) depicts the bare photoresist substrate with no additional layers disposed on it;

FIG. 1(B) depicts disposing of the first composition on the photoresist substrate;

FIG. 1(C) depicts the substrate with the first composition disposed thereon being subjected to an optional baking step;

FIG. 1(D) depicts a second block of the blocked hydrogen acceptor or the blocked hydrogen donor being formed on the first block;

FIG. 1(E) depicts the second block being subjected to deprotection by exposure to an acid or an acid generator, to radiation and/or to an elevated temperature to form a second block that comprises an unblocked hydrogen acceptor or unblocked hydrogen donor;

FIG. 1(F) depicts the disposing of the first composition on the second block;

FIG. 1(G) depicts the build-up of multiple layers of the block copolymer on the substrate;

DETAILED DESCRIPTION

Figure 2C:
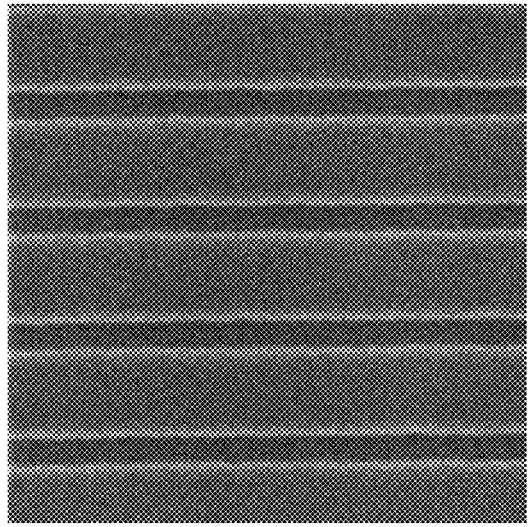
FIG. 2(C) shows top-down SEM images of line/space patterns after a shrink method from Example 9.

Disclosed herein is a shrink composition that comprises a first composition and an optional second composition. The first composition comprises a block copolymer that comprises at least two blocks. The two blocks include a first block and a second block where the first block comprises a repeat unit that comprises a hydrogen acceptor or a hydrogen donor, and where the second block comprises a repeat unit that comprises a blocked donor when the repeat unit of the first block is a hydrogen acceptor, or a blocked acceptor when the repeat unit of the first block is a hydrogen donor. The shrink composition may also include a solvent.

The term "block" as used herein refers to a block polymer. Thus the first block refers to a first block polymer and the second block refers to a second block polymer.

The second composition is the same or different from the first composition and comprises a block copolymer comprising a first block and a second block, wherein the first block comprises a repeat unit containing a hydrogen acceptor or a hydrogen donor, and the second block comprises a repeat unit containing a blocked acid when the repeat unit of the first block is a hydrogen acceptor, or a blocked base when the repeat unit of the first block is a hydrogen donor; and a solvent.

Disclosed herein too is a method, comprising providing a substrate and disposing the shrink composition on the substrate. The block copolymer upon being disposed on the substrate undergoes phase separation into two or more layers, where each layer has its largest surface that is parallel to a substrate surface. Upon undergoing phase separation, the method further includes deprotecting the hydrogen acceptor or the hydrogen donor with a deprotecting agent.

Disclosed herein too is an article comprising a substrate upon which is disposed a first layer and a second layer. Each layer comprises a block copolymer. The first layer comprises a first block copolymer that has a first block and a second block. The first layer is the innermost layer and is reactively bonded to the substrate by covalent or ionic bonding. The first block comprises a repeat unit containing a hydrogen acceptor or a hydrogen donor and the second block comprises a repeat unit containing a blocked donor when the repeat unit of the first block is a hydrogen acceptor or a blocked acceptor when the repeat unit of the first block is a hydrogen donor.

The second layer comprises a second block copolymer that comprises a first block and a second block. In the second block, the first block comprises a repeat unit that contains a hydrogen acceptor or a hydrogen donor while the second block comprises a repeat unit containing a blocked donor when the repeat unit of the first block is a hydrogen acceptor or a blocked acceptor when the repeat unit of the first block is a hydrogen donor. The second layer is the outermost layer and is bonded to the first layer.

In an embodiment, the first block copolymer is a part of a first composition that is disposed on the substrate, while the second block copolymer is a part of a second composition that is disposed on the first composition after it is disposed on the substrate. In an embodiment, the first composition may be subjected to treatments including removing residual first composition from the substrate before deprotecting the blocked acceptor or the blocked donor of the first composition, leaving a coating of the first block copolymer over the substrate. The disposing of the second composition is conducted after deprotecting the blocked acceptor or the blocked donor of the first composition. The second composition may also be subjected to treatments including removing residual second composition from the substrate before deprotecting the blocked acceptor or the blocked donor of the second composition, leaving a coating of the second block copolymer over the first block copolymer.

In an embodiment, the substrate is a semiconductor substrate. In another embodiment, the substrate comprises a photoresist pattern on which the two or more layers are disposed, wherein the first block of the block copolymer of the innermost layer is bonded to the photoresist pattern. The photoresist pattern is formed by a negative tone development process where the photoresist pattern comprising carboxylic acid and/or hydroxyl groups on a surface thereof.

Patterning for integrated circuits presently uses smaller features than those that are possible with single 193 nm wavelength exposure. Several options currently exist for hole/trench shrink features, including chemical vapor deposition (CVD) overcoating, acid diffusion resist growth and polymer blend self-assembly. CVD is not desirable due to added complexity and cost and acid diffusion and polymer blend strategies suffer from proximity and size effects. For example, with immiscible polymer blends, since the shrink ratio is dictated by the volume of the two components, all features shrink by the same relative percentage rather than by the same amount. Therefore, there is a need for a spin-on solution that affords a pattern shrink process with consistent shrink regardless of feature size or density.

The first composition comprises a block copolymer. The block copolymer may be a diblock copolymer, a triblock copolymer, a star block copolymer, a gradient copolymer, or the like, or a combination thereof. The block copolymer comprises a first block that comprises a repeat unit that contains a hydrogen acceptor or a hydrogen donor, and where the second block comprises a repeat unit containing a blocked donor when the repeat unit of the first block is a hydrogen acceptor, or a blocked acceptor when the repeat unit of the first block is a hydrogen donor. The first block and the second block are each polymers that are covalently bonded to each other. The block copolymer is sometimes referred to as a block copolymer multilayer electrolyte (BCP-ME).

In an embodiment, the block copolymer may also contain a neutral block (also referred to as an innocent block). The neutral block does not contain any charged species. The neutral block may be covalently or ionically bonded to the blocked donor block, the acceptor block, or to both the blocked donor block and the acceptor block in a block copolymer where the donor block is blocked. It may alternatively be covalently or ionically bonded to the donor block, the blocked acceptor block or to both the donor block and the blocked acceptor block in copolymers that comprise the donor block and a blocked acceptor block.

In an embodiment, the at least one of the first block or the second block may comprise a random copolymer of monomeric units that form the first block or the second block respectively copolymerized with monomeric units of a neutral block.

The hydrogen acceptor containing block comprises a nitrogen-containing group. Suitable nitrogen-containing groups can form an ionic bond with an acid group at the surface of the resist pattern. Useful nitrogen-containing groups include, for example, amine groups and amide groups, for example, primary amines such as amine, secondary amines such as alkylamines including N-methylamine, N-ethylamine, N-t-butylamine, and the like, tertiary amines such as N,N-dialkylamines including N,N-dimethylamine, N,N-methylethylamine, N,N-diethylamine, and the like. Useful amide groups include alkylamides such as N-methylamide, N-ethylamide, N-phenylamide, N,N-dimethylamide, and the like. The nitrogen-containing groups can also be part of a ring, such as pyridine, indole, imidazole, triazine, pyrrolidine, azacyclopropane, azacyclobutane, piperidine, pyrrole, purine, diazetidine, dithiazine, azocane, azonane, quinoline, carbazole, acridine, indazole, benzimidazole, and the like. Preferred nitrogen containing groups are amine groups, amide groups, pyridine groups, or a combination thereof. In an embodiment, the amine in the block copolymer forms an ionic bond with the free acid at the surface of the substrate (e.g., the surface of the resist, which will be discussed later) to anchor the block copolymer.

In an embodiment, the repeat unit of the first block contains a hydrogen acceptor. The first block containing the hydrogen acceptor comprises a nitrogen containing group. Examples of hydrogen acceptor containing blocks that comprise a nitrogen containing group are shown below in the Formulas (1) to (2).

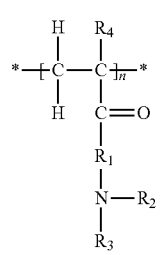

(1)

where n is the number of repeat units, and where $R_1$ is a $C_1$ to $C_{30}$ alkyl group, preferably a $C_2$ to $C_{10}$ alkyl group, $R_2$ and $R_3$ can be the same or different and can be hydrogen, a hydroxyl, a $C_1$ to $C_{30}$ alkyl group, preferably a $C_1$ to $C_{10}$ group, and wherein $R_4$ is a hydrogen or a $C_1$ to $C_{30}$ alkyl group.

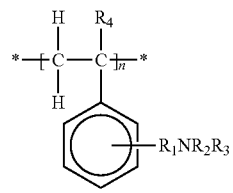

(2)

where n, $R_1$, $R_2$, $R_3$ and $R_4$ are defined above in the Formula (1).

A preferred form of the structure of the Formula (2) is shown below in the Formula (3):

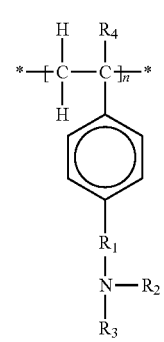

(3)

where the $R_1NR_2R_3$ group is located at the para-position, and where n, $R_1$, $R_2$, $R_3$ and $R_4$ are defined above in the Formula (1).

Another example of a hydrogen acceptor containing block that comprises a nitrogen containing group is shown below in the Formula (4)

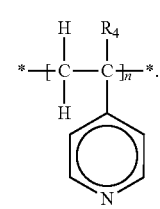

(4)

In the formula (4), n and $R_4$ are defined in Formula (1) and the nitrogen atom can be in the ortho, meta, para positions or any combination thereof (e.g., in both the ortho and para positions).

Yet another example of a hydrogen acceptor containing block that comprises a nitrogen containing group are shown below in the Formula (5)

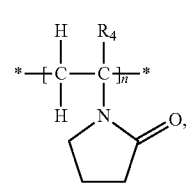

(5)

where n and $R_4$ are defined above.

Yet another example of a hydrogen acceptor containing block that comprises a nitrogen containing group are poly(alkylene imines) shown below in the Formula (6)

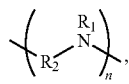
(6)

where $R_1$ is a 5 membered ring that is substituted with 1-4 nitrogen atoms, $R_2$ is a $C_1$ to $C_{15}$ alkylene and n represents the total number of repeat units. An example of the structure of Formula (6) is polyethyleneimine. Exemplary structures of the hydrogen acceptor of the Formula (6) are shown below.

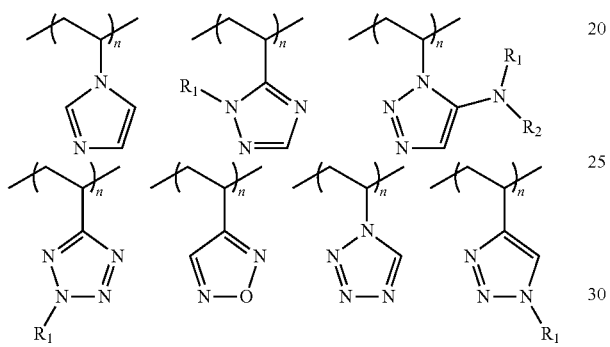

As noted above, the block comprising the hydrogen acceptor may be protected by a blocking group when the donor group is not blocked and vice versa. The hydrogen acceptor may be protected or blocked by an acid decomposable group, a thermally decomposable group or a group that can be decomposed by electromagnetic radiation. In an embodiment, the acid decomposable group can be thermally decomposed or decomposed as a result of exposure to electromagnetic radiation.

An example of an acid decomposable group that may be used for the blocking is a $C_{4-30}$ tertiary alkyl ester. Exemplary $C_{4-30}$ tertiary alkyl groups include 2-(2-methyl)propyl ("t-butyl"), 2-(2-methyl)butyl, 1-methylcyclopentyl, 1-ethylcyclopentyl, 1-methylcyclohexyl, 1-ethylcyclohexyl, 2-methyladamantyl, 2-ethyladamantyl, or a combination comprising at least one of the foregoing. In a specific embodiment, the acid decomposable group is a t-butyl group or an ethylcyclopentyl group.

Additional decomposable groups for protecting carboxylic acids include substituted methyl esters such as methoxymethyl, tetrahydropyranyl, tetrahydrofuranyl, 2-(trimethylsilyl)ethoxymethyl, benzyloxymethyl, and the like; 2-substituted ethyl esters, such as 2,2,2-trichloroethyl, 2-haloethyl, 2-(trimethylsilyl)ethyl, and the like; 2,6-dialkylphenyl esters such as 2,6-dimethylphenyl, 2,6-diisopropylphenyl, benzyl, and the like; substituted benzyl esters such as triphenylmethyl, p-methoxybenzyl, 1-pyrenylmethyl, and the like; silyl esters such as trimethylsilyl, di-t-butylmethylsilyl, triisopropylsilyl, and the like.

Examples of groups that can be decomposed by electromagnetic radiation to form a free carboxylic acid or alcohol include:

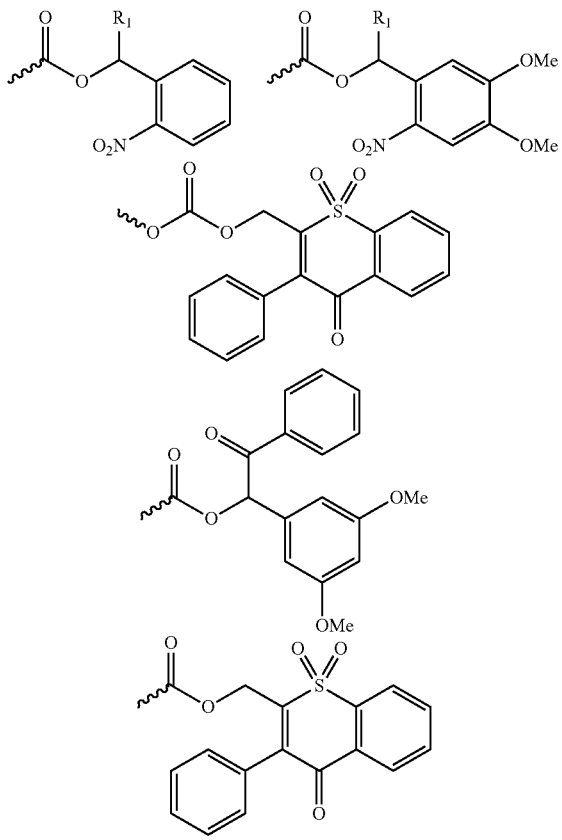

Examples of groups that can be decomposed by electromagnetic radiation to form a free amine include:

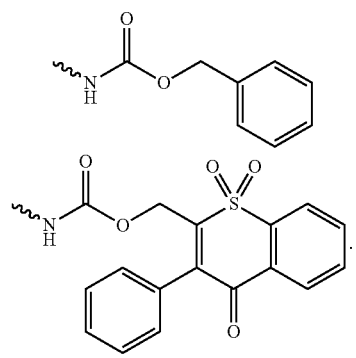

Additional protecting groups and methods to decompose them are known in the art of organic chemistry and are summarized by Greene and Wuts in "Protective groups in organic synthesis", Third Edition, John Wiley & Sons, Inc., 1999.

The second block (also referred to as a blocked hydrogen donor) contains a protected acid group and/or a protected alcohol group when the first block contains a hydrogen acceptor that is not blocked. The acid and/or alcohol group is protected by a moiety that can be deprotected by exposure to an acid, to an acid generator (such as thermal acid generator or a photoacid generator), to thermal energy or to electromagnetic radiation. Suitable acid decomposable groups are listed above.

The temperature of decomposition of the protected group is 100 to 250° C. The electromagnetic radiation comprises UV radiation, infrared radiation, xrays, electron beam radiation, and the like. Exemplary protected groups are shown below in the formulas (7) (12D).

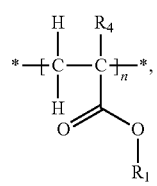
(7)

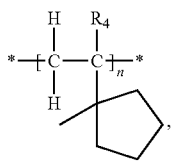
(8)

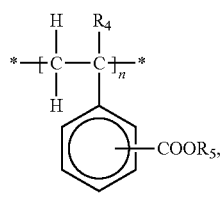
(9)

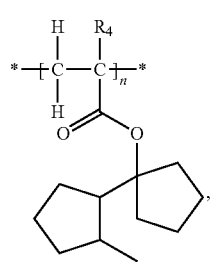
(10)

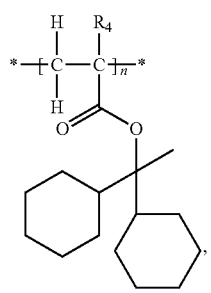
(11)

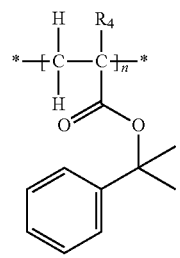
(12A)

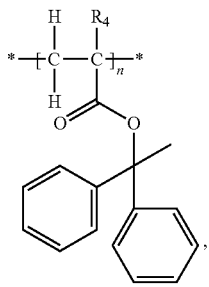
(12B)

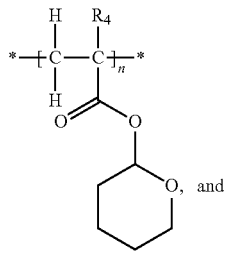
(12C)

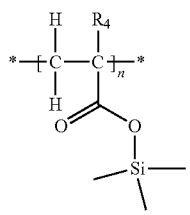
(12D)

where n is the number of repeat units, $R_1$ is a $C_1$ to $C_{30}$ alkyl group, preferably a $C_2$ to $C_{10}$ alkyl group, $R_4$ is the formulas (7) through (12D) is a hydrogen, a $C_1$ to $C_{10}$ alkyl, and where $R_5$ is a hydrogen or a $C_1$ to $C_{10}$ alkyl. In the formula (12C), the oxygen heteroatom may be located at either the ortho, meta or para position.

Other acid groups that may be protected can include phosphoric acid groups and sulfonic acid groups. Shown below are blocks that contain a sulfonic acid group and a phosphoric acid group that may be used in the block copolymer.

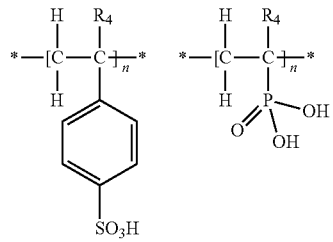

Suitable oxygen-containing groups can form a hydrogen bond with a deprotected alcohol group at the surface of the resist pattern. Useful oxygen-containing groups include, for example, ether and alcohol groups. Suitable alcohols include, for example, primary hydroxyl groups such as hydroxymethyl, hydroxyethyl, and the like; secondary hydroxyl groups such as 1-hydroxyethyl, 1-hydroxypropyl, and the like; and tertiary alcohols such as 2-hydroxypropan-2-yl, 2-hydroxy-2-methylpropyl, and the like; and phenol derivatives such as 2-hydroxybenzyl, 3-hydroxybenzyl, 4-hydroxybenzyl, 2-hydroxynaphthyl, and the like. Useful ether groups include, for example, methoxy, ethoxy, 2-methoxyethoxy, and the like. Other useful oxygen-containing groups include diketone functionalities such as pentane-2,4-dione, and ketones such as ethanone, butanone, and the like.

Examples of the protected alcohol block are shown in the Formulas (13) and (14),

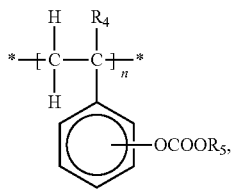
(13)

and

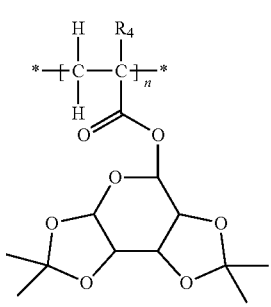
(14)

where n is the number or repeat units, $R_4$ is the Formula (12) is a hydrogen or a $C_1$ to $C_{10}$ alkyl, and where $R_5$ is a hydrogen or a $C_1$ to $C_{10}$ alkyl.

Examples of the neutral block are polystyrene, polyacrylates, polyolefins, polysiloxanes, polycarbonates, polyacrylics, polyesters, polyamides, polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyanhydrides, polyvinyl ethers, polyvinyl thioethers, polyvinyl ketones, polyvinyl halides, polyvinyl nitriles, polyvinyl esters, polysulfonates, polysulfides, polythioesters, polysulfonamides, polyureas, polyphosphazenes, polysilazanes, or the like, or a combination thereof. Exemplary neutral block polymers are shown below in the Formulas (15)-(17):

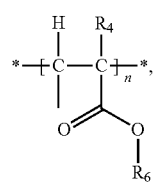
(15)

where n is the number of repeat units, $R_4$ is a hydrogen or a $C_1$ to $C_{10}$ alkyl and where $R_6$ can be a $C_1$ to $C_{10}$ alkylene group;

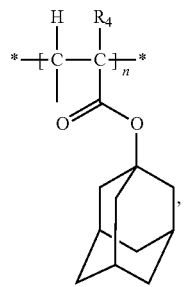
(16)

and

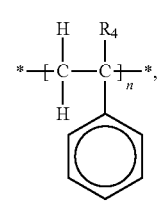
(17)

where n is the number of repeat units, $R_4$ is a hydrogen or a $C_1$ to $C_{10}$ alkyl in formulas (16) and (17).

Examples of protected amine blocks (blocked or protected acceptors) are shown below in the formulas (18)-(21). Examples of protected alcohols (blocked or protected acceptors) are shown below in the formulas (22)-(24).

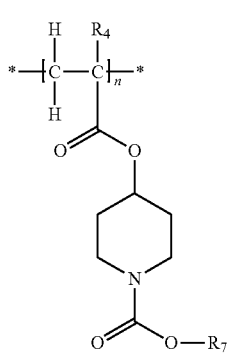
(18)

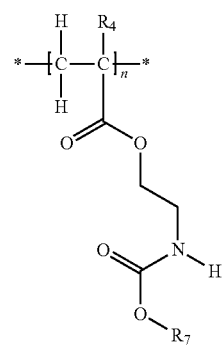
(19)

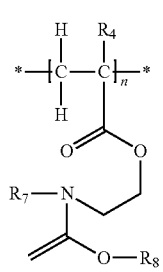
(20)
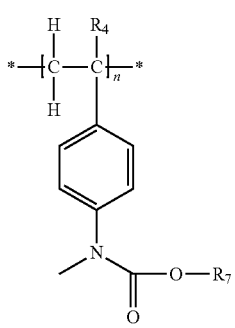
(21)
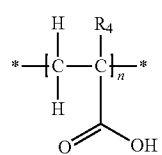
(22)
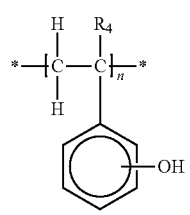
(23)
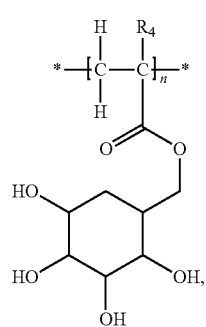
(24)
where in the applicable formulas (18) through (24), $R_4$ is a hydrogen or a $C_1$ to $C_{10}$ alkyl, $R_7$ and $R_8$ are the same or different and are independently a $C_1$ to $C_{30}$ alkyl group, and preferably a $C_1$ to $C_{10}$ group.
Examples of diblock copolymers that may be used as block copolymers-multilayer electrolytes are shown below.
diblocks
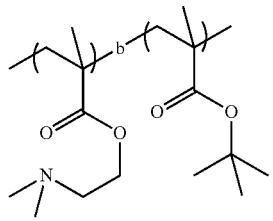
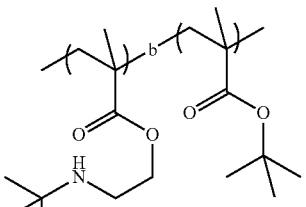
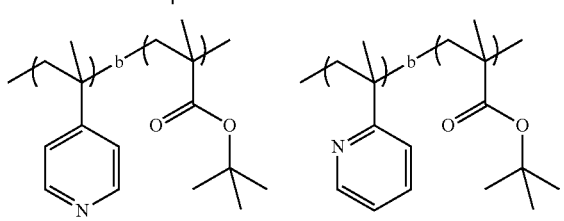
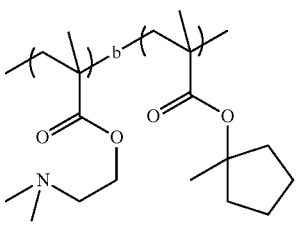
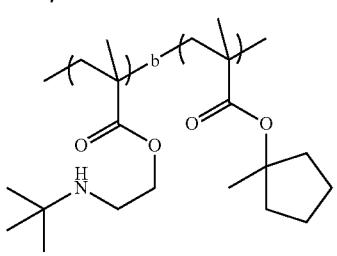
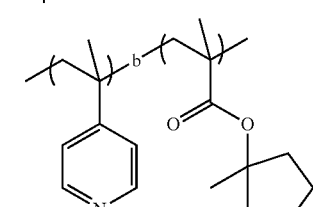
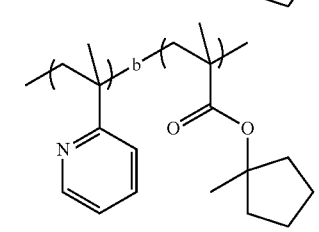

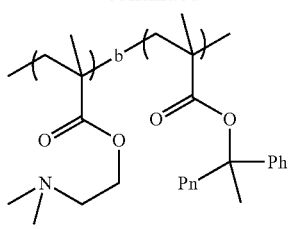
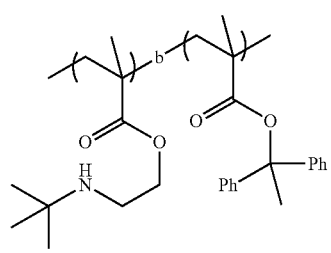
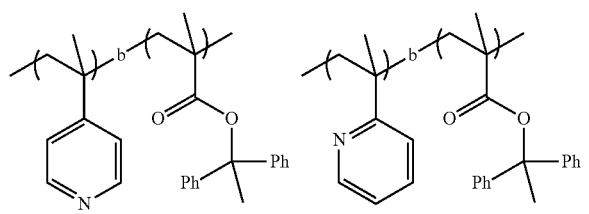
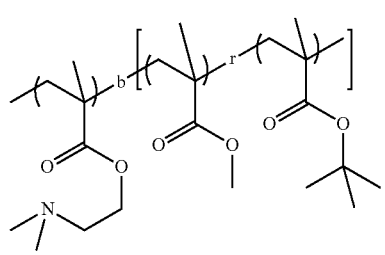
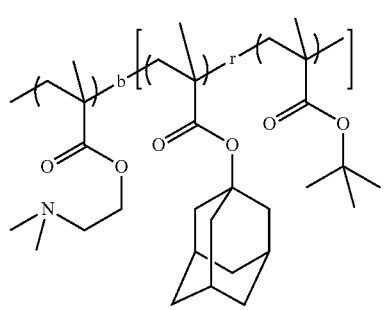
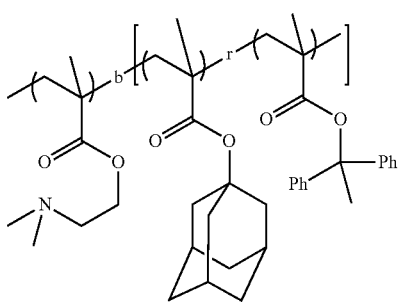

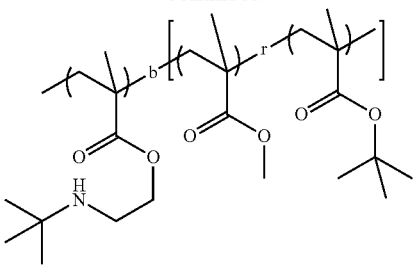
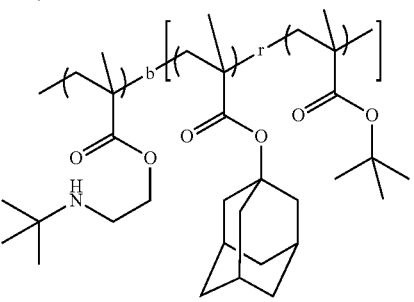
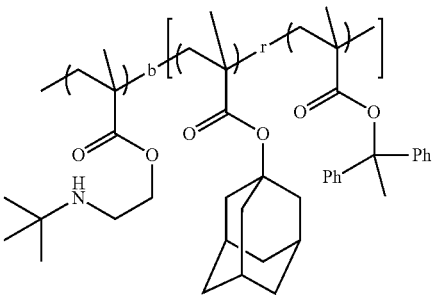

Suitable block copolymers useful in the shrink compositions include, for example: poly[(neopentyl methacrylate)-block-(N,N-dimethylaminoethyl methacrylate)], poly[(neopentyl methacrylate)-block-(2-(tert-butylamino)ethyl methacrylate)], poly[(tert-butylmethacrylate)-block-(N,N-dimethylaminoethyl methacrylate)], poly[(tert-butylmethacrylate)-block-(2-(tert-butylamino)ethyl methacrylate)], poly[styrene-block-(N,N-dimethylaminoethyl methacrylate)], poly[styrene-block-(2-vinylpyridine)], poly[(4-trimethylsilylstyrene)-block-(2-vinylpyridine)], poly[(trimethylsilylmethyl methacrylate)-block-(N,N-dimethylaminoethyl methacrylate)], poly[(4-trimethylsilylstyrene)-block-(N,N-dimethylaminoethyl methacrylate)], poly[(trimethylsilylmethyl methacrylate)-block-(2-vinylpyridine)], poly(neopentyl methacrylate)-block-(N,N-dimethylaminoethyl methacrylate), poly(neopentyl methacrylate)-block-poly(2-(tert-butylamino)ethyl methacrylate), poly(tert-butylmethacrylate)-block-poly(N,N-dimethylaminoethyl methacrylate), poly(tert-butylmethacrylate)-block-poly(2-(tert-butylamino)ethyl methacrylate), polystyrene-block-poly(N,N-dimethylaminoethyl methacrylate), polystyrene-block-poly(2-vinylpyridine), poly(4-trimethylsilylstyrene)-block-poly(2-vinylpyridine), poly(trimethylsilylmethyl methacrylate)-block-poly(N,N-dimethylaminoethyl methacrylate), poly(4-trimethylsilylstyrene)-block-poly(N,N-dimethylaminoethyl methacrylate), and poly(trimethylsilylmethyl methacrylate)-block-poly(2-vinylpyridine).

Triblock copolymers having a neutral block that is covalently bonded to both the hydrogen acceptor and the blocked donor block are shown below.

triblocks with "innocent" middle blocks
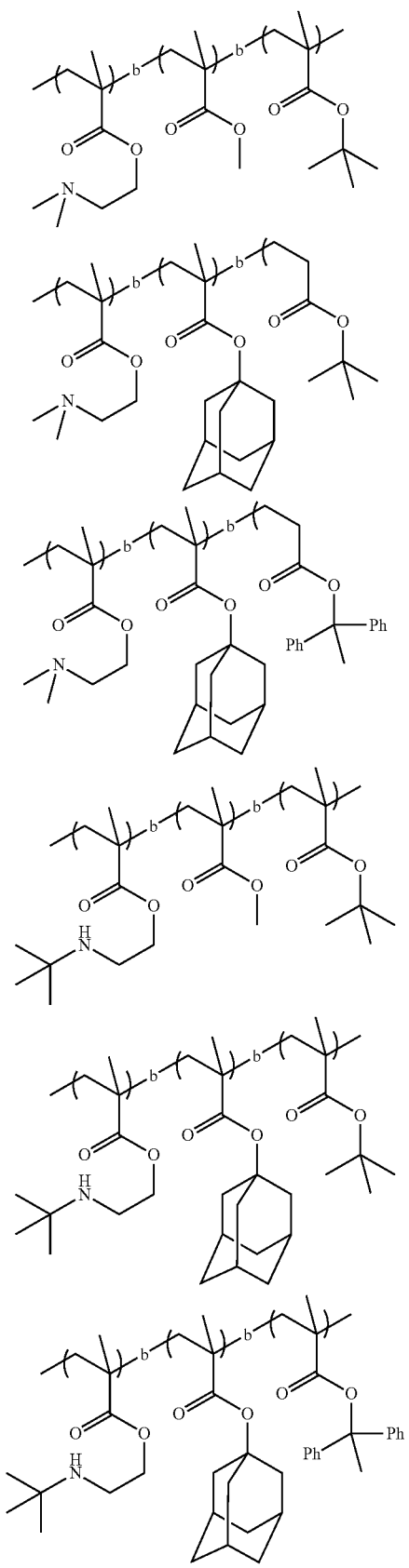
-continued
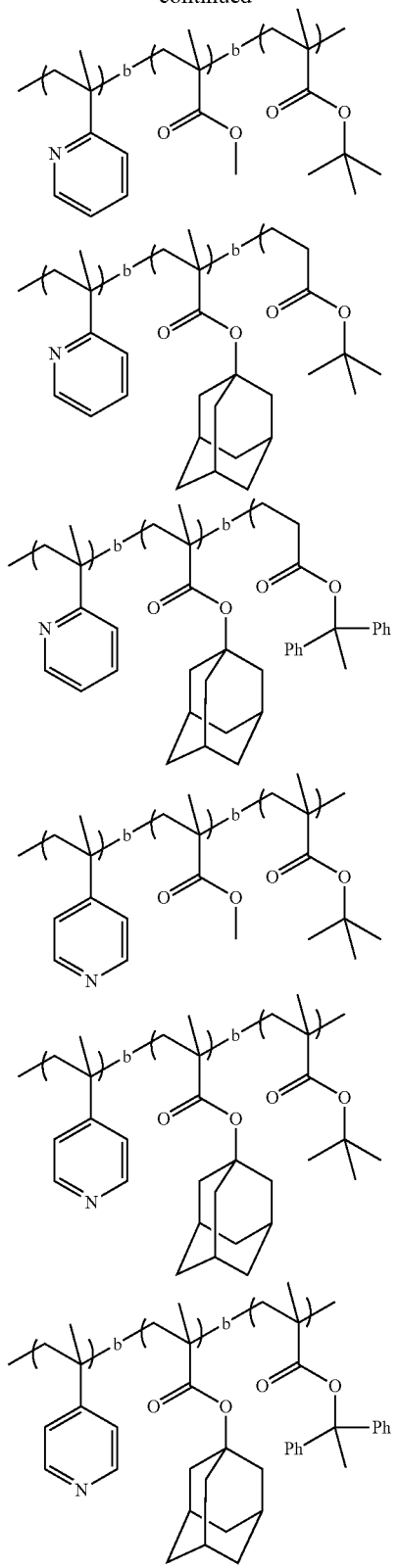
In an embodiment, the block copolymer may be a diblock or triblock copolymer where each block has a pendant aromatic group. At least one block comprises a repeat unit containing a hydrogen acceptor or a hydrogen donor, while the second block comprises a repeat unit containing a blocked donor when the repeat unit of the first block is a hydrogen acceptor, or a blocked acceptor when the repeat unit of the first block is a hydrogen donor. In a triblock copolymer, at least one block may be a neutral block. An exemplary block copolymer where every block has a pendant aromatic group is shown below in Formula (25):

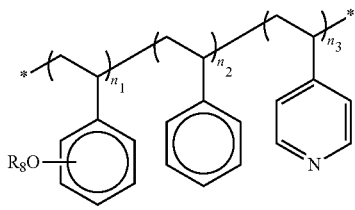

(25)

where $n_1$, $n_2$ and $n_3$ are the number of repeat units for each block, and where $R_8$ is a $C_1$ to $C_{30}$ alkyl group, a hydroxyl group, or the like.

By selection of a suitable block copolymer, the amount of growth of the shrink polymer on the resist pattern can be accurately controlled. This thickness can be controlled, for example, by selection of a suitable molecular weight, with higher molecular weights resulting in greater thicknesses and vice-versa. The chemical composition of the shrink polymer can also influence the amount of growth. For example, polymers with a longer unperturbed end-to-end distance or characteristic ratio provide larger shrink for a given molecular weight.

The first block is present in the block copolymer in an amount of 40 to 60 mole percent, preferably in an amount of 45 to 55 mole percent based on the total number of moles of the block copolymer while the second block is present in the block copolymer in an amount of 40 to 60 mole percent, preferably in an amount of 45 to 55 mole percent based on the total number of moles of the block copolymer.

The block copolymer should have good solubility in an organic solvent used in the composition and an organic solvent used to rinse and completely remove excess copolymer (i.e., polymer not attached to the resist pattern) from the substrate. The content of the copolymer in the shrink compositions will depend, for example, on the desired coating thickness of the shrink composition. The copolymer is typically present in the shrink compositions in an amount of from 80 to 99 wt %, more preferably from 90 to 98 wt %, based on total solids of the shrink composition. The weight average molecular weight of the polymer is typically less than 400,000, preferably from 5000 to 200,000, more preferably from 1000 to 125,000 grams per mole (g/mol).

The first composition and the second composition may further include an organic solvent which can be in the form of a single organic solvent or a mixture of organic solvents. Suitable solvent materials to formulate and cast the pattern treatment compositions exhibit excellent solubility characteristics with respect to the non-solvent components of the compositions, but do not appreciably dissolve an underlying photoresist pattern. Suitable organic solvents for the pattern treatment compositions include, for example: alkyl esters such as n-butyl acetate, n-butyl propionate, n-pentyl propionate, n-hexyl propionate and n-heptyl propionate, and alkyl butyrates such as n-butyl butyrate, isobutyl butyrate and isobutyl isobutyrate; ketones such as 2-heptanone, 2,6-dimethyl-4-heptanone and 2,5-dimethyl-4-hexanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; toluene, anisole and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the composition is typically present in an amount of from 75 to 99 wt % based on the shrink composition.

In one method of manufacturing a photoresist, the block copolymer may be blended with an appropriate amount of solvent to form the first composition. The first composition is disposed upon a negative tone development (NTD) photoresist. FIG. 1 depicts a series of steps of manufacturing a NTD shrink substrate.

The substrate 100 can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 (described in detail later) may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer (not shown) is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Dow Electronic Materials (Marlborough, Mass. USA), such as AR™40A and AR™124 antireflectant materials.

A photoresist layer (not shown) formed from a composition such as described herein is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer is from about 500 to 3000 Å.

The photoresist layer can next be soft baked to minimize the solvent content in the layer, thereby forming a tack-free coating and improving adhesion of the layer to the substrate. The soft bake can be conducted on a hotplate or in an oven, with a hotplate being typical. The soft bake temperature and time will depend, for example, on the particular material of the photoresist and thickness. Typical soft bakes are conducted at a temperature of from about 90 to 150° C., and a time of from about 30 to 90 seconds.

The photoresist layer is next exposed to activating radiation through a patterned photomask (not shown) to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to remain and be removed, respectively, in a subsequent development step. The exposure wavelength is typically sub-400 nm, sub-300 nm or sub-200 nm, with 248 nm, 193 nm and EUV wavelengths (e.g., 13.5 nm) being typical. The methods find use in immersion or dry (non-immersion) lithography techniques. The exposure energy is typically from about 10 to 80 mJ/cm$^2$, dependent upon the exposure tool and the components of the photoresist composition.

Following exposure of the photoresist layer, a post-exposure bake (PEB) is performed. Acid generated by the acid generator causes cleavage of the acid cleavable leaving groups to form acid groups, typically carboxylic acid groups, and/or alcohol groups. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

FIG. 1(A) depicts the bare photoresist substrate 100 with no additional layers disposed on it while the FIG. 1(B) depicts disposing of the first composition 102 on the photoresist substrate 100.

The substrate 100 can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned (not shown) may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched will vary depending on the materials and particular devices being formed.

The first composition 102 may be subjected to etching using a photoresist (not shown). The substrate with the first composition disposed thereon is then subjected to an optional baking step as seen in the FIG. 1(C). The baking is conducted at a temperature greater than room temperature preferably at a temperature of 70° C. to a temperature that is lower than the glass transition temperature of either of the polymers that are used in the blocks of the block copolymer. In an embodiment, the baking may be conducted to a temperature of greater than or equal to 110° C., preferably greater than or equal to about 130° C. and preferably greater than or equal to 170° C. The substrate is then rinsed to remove unreacted polymer (see FIG. 1(C). Phase separation of the first block from the second block that occurs during the disposing step and possibly during the baking step facilitates the development of a first block 103 that comprises either the hydrogen acceptor or hydrogen donor on the NTD shrink substrate. A second block 104 of the blocked hydrogen acceptor or the blocked hydrogen donor is then formed on the first block 103 as seen in the FIG. 1(D). The first block 103 and the second block 104 form the first layer. As noted above, if the first block 103 comprises a hydrogen acceptor, then the second block 104 comprises a blocked hydrogen donor. Alternatively, if the first block 103 comprises a hydrogen donor, then the second block 104 comprises a blocked hydrogen acceptor.

Following the phase separation as seen in the FIG. 1(E), the second block 104 is subjected to deprotection by exposure to an acid or an acid generator, to radiation and/or to an elevated temperature to form a second block 106 that comprises an unblocked hydrogen acceptor or unblocked hydrogen donor. In an embodiment, the second block 104 is treated with an acid generator layer 105 that facilitates deprotection of the blocked hydrogen acceptor or the blocked hydrogen donor to form the second block 106 that comprises an unblocked hydrogen acceptor or unblocked hydrogen donor.

The process depicted in the FIGS. 1(B) through 1(E) is repeated in the FIGS. 1(F) through 1(G). In other words, a second composition comprising either the same copolymer or a different block copolymer that comprises a first block and a second block is disposed on the substrate that now contains the first block 103 and the second block 106. The second composition is subjected to baking and rinsing as seen in the FIG. 1(C) to form a third block and fourth block 107 and 108 respectively on the photoresist substrate. In one embodiment, the first block 107 of the second composition is similar (in composition) to the first block 103 formed by the deposition of the first composition and the second block 108 is similar (in composition) to the second block 104 formed by the deposition of the first composition on the photoresist substrate.

In another embodiment, the first block 107 and/or second block 108 formed by the deposition of the second composition may be the same or different from the first block 103 and/or the second block 104 formed by the deposition of the first composition on the photoresist substrate. In other words, the first blocks 103 and 107 may be chemically similar to each other while the second blocks 104 and 108 may be different from each other or alternatively, the first blocks 103 and 107 are chemically different from each other, while the second blocks 104 and 108 are chemically similar to one another. As can be seen in the FIG. 1, the blocks 103, 104, 107 and 108 have surfaces that are parallel to the surface of the photoresist substrate. It is to be noted that blocks 103 and 104 together form the first layer, while blocks 107 and 108 form the second layer.

In an embodiment, the deprotection step may be simultaneously performed on a plurality of layers that contain the blocked hydrogen acceptor or the blocked hydrogen donor. This can occur by simultaneously subjecting the photoresist substrate with a plurality of first compositions and second compositions disposed thereon to be treated to an acid generator and/or to electromagnetic radiation and/or to thermal decomposition.

Photoresist Compositions

Photoresist compositions useful in the invention include chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following soft bake, exposure to activating radiation and post exposure bake. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group. Suitable photoresist compositions useful for the invention are commercially available.

For imaging at certain sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer. Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene. Blends of two or more of the above-described matrix polymers can suitably be used in the photoresist compositions.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000 grams per mole.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis(2-hydroxyethyl)pivalamide, N,N-diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2",2"'-(ethane-1,2-diylbis(azanetriyl))tetraethanol, and 2-(dibutylamino)ethanol, 2,2', 2"-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Suitable photoresists are known in the art and include, for example, photoresists described in US Patent Publications US20130115559A1, US20110294069A1, US20120064456A1, US20120288794A1, US20120171617A1, US20120219902A1 and U.S. Pat. No. 7,998,655B2.

The article and the method detailed herein are exemplified in the following non-limiting examples.

EXAMPLES

Number and weight-average molecular weights, Mn and Mw respectively, and polydispersity values, Mw/Mn or PDI, were measured by gel permeation chromatography (GPC) on an Agilent 1100 series LC system equipped with an Agilent 1100 series refractive index and MiniDAWN light scattering detector (Wyatt Technology Co.). Samples were dissolved in HPCL grade THF at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton NMR spectroscopy was done on a Varian INOVA 400 MHz NMR spectrometer. Deuterated tetrahydrofuran was used for all NMR spectra. A delay time of 10 seconds was used to ensure complete relaxation of protons for quantitative integrations. Chemical shifts were reported relative to tetramethylsilane (TMS).

All materials were commercial materials and were used as received unless otherwise indicated. The copolymer structures that are detailed in the following examples are shown below.

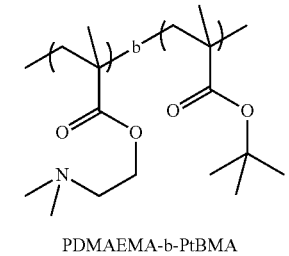

PDMAEMA-b-PtBMA

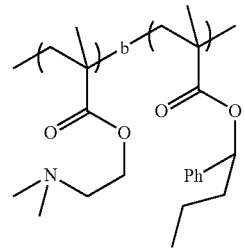

PDMAEMA-b-PPMA

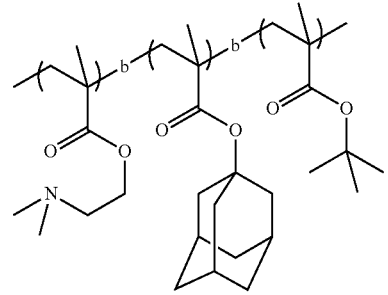

PDMAEMA-b-PAdMA-b-PtBMA

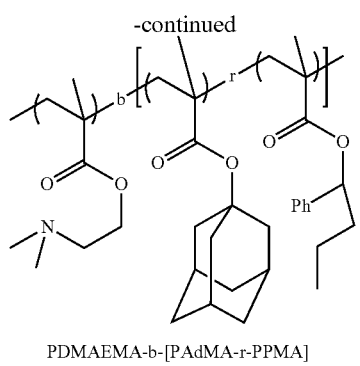

PDMAEMA-b-[PAdMA-r-PPMA]

Example 1

This example details the synthesis of a first composition that comprises a block copolymer that contains poly(N,N'-dimethylaminoethylmethacrylate)-block-poly(t-butylmethacrylate) (PDMAEMA-b-PtBMA).

Dimethyl 2,2'-azobis(2-methylpropionate) (0.101 grams (g)), tert-butylmethacrylate (tBMA, 20.000 g), 2-cyanopropan-2-yl benzodithioate (CPBD, 0.389 g), ethyl acetate (20 mL) and a magnetic stir bar were loaded into a 250 milliliters (mL) glass bottle. The mixture was deoxygenated by nitrogen gas for 1 hour (hr) and then the flask was placed in a heat block at 70° C. for 24 hours. After the reaction, the flask was cooled, ethyl acetate was evaporated by keeping the bottle open for 2 hours and bubbling $N_2$. The reaction mixture was then dissolved in 60 mL THF and precipitated into 1 liter (L) methanol/water mixture (9:1). The precipitate was collected and re-precipitated. The polymer polytert-butylmethacrylate (PtBMA) was collected and dried in a vacuum oven at room temperature overnight. Using PtBMA as a macroinitiator, 2-(dimethylamino)ethyl methacrylate (DMAEMA) monomers were polymerized using a similar procedure set forth above. 3.000 g of PtBMA, 3.315 g of DMAEMA, 0.065 g of dimethyl 2,2'-azobis(2-methylpropionate) and a magnetic stir bar were loaded into a 50 mL reactor. Ethyl acetate (6 mL) was deoxygenated and added to the reactor in a glove box. The reactor was then sealed with a septum and placed in a heat block at 70° C. for 24 hrs. After the reaction, the flask was cooled, ethyl acetate was evaporated by keeping the bottle open for 2 hours and bubbling $N_2$. The reaction mixture was then dissolved in 60 mL of THF and precipitated into 1 L methanol/water mixture (9:1). The precipitate was collected and re-precipitated. The polymer was collected and dried in a vacuum oven at room temperature overnight. The resulting PtBMA-b-PDMAEMA had Mn of 24.2 kg/mol, polydispersity index (PDI) of 1.29, and 54 mole % PDMAEMA by 1H NMR.

Example 2

This example details the synthesis of poly(N,N'-dimethylaminoethylmethacrylate)-block-poly(adamantylmethacrylate)-block-poly(t-butylmethacrylate) (PDMAEMA-b-PAdMA-b-PtBMA). Adamantyl methacrylate (AdMA) is the repeat unit used in forming the neutral block. The neutral block therefore comprises poly(1-admantyl methacrylate). Using the PtBMA from Example 1 as a macroinitiator, AdMA monomers were polymerized using a similar procedure set forth above. 2.00 g of PtBMA, 13.3 g of AdMA, 0.014 g of dimethyl 2,2'-azobis(2-methylpropionate), PGMEA (15 mL) and a magnetic stir bar were loaded into a 50 mL air-free reactor. The mixture was freeze-pump-thawed three times and then the flask was placed in a heat oil bath at 70° C. for 16 hours. After the reaction, the flask was cooled, the reaction mixture was then dissolved in 10 mL THF and precipitated into 1 L acetonitrile. The precipitate was collected and re-precipitated. The polymer (PAdMA-b-PtBMA) was collected and dried in a vacuum oven at room temperature overnight. The resulting PAdMA-b-PtBMA had Mn of 15.2 kg/mol and PDI of 1.17.

Using PAdMA-b-PtBMA as a macroinitiator, the last block using 2-(dimethylamino)ethyl methacrylate (DMAEMA) monomers were polymerized using a similar procedure set forth above. 7.00 g of PAdMA-b-PtBMA, 2.10 g of DMAEMA, 0.008 g of dimethyl 2,2'-azobis(2-methylpropionate), dioxane (27 mL) and a magnetic stir bar were loaded into a 200 mL air-free reactor. The mixture was freeze-pump-thaw three times and then the flask was placed in a heat oil bath at 70° C. for 16 hours. After the reaction, the flask was cooled, the reaction mixture was then dissolved in 10 mL THF and precipitated into 1 L acetonitrile. The precipitate was collected and re-precipitated. The polymer (PDMAEMA-b-PAdMA-b-PtBMA) was collected and dried in a vacuum oven at room temperature overnight. The resulting PDMAEMA-b-PAdMA-b-PtBMA had Mn of 19.5 kg/mol, PDI of 1.22, and 22.0 wt % PDMAEMA by $^1$H NMR.

Example 3

This example details the synthesis of poly(N,N'-dimethylaminoethylmethacrylate)-block-poly(adamantylmethacrylate-random-1,1-diphenylethylmethacrylate) (PDMAEMA-b-P(AdMA-r-PPMA)). The monomers and solvents were freeze-pump-thawed three times to remove oxygen. All the three monomers were further purified prior to use with activated $Al_2O_3$ and were diluted with cyclohexane to about 50 vol % concentration. An amount of tetrahydrofuran (THF) required for a reaction concentration of about 7-10 wt % solids was transferred to a reactor containing pre-dried LiCl. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of diphenyl ethylene (DPE), 0.442 g, and Sec butyl lithium initiator (3.79 g, 0.43M in cycloxeane) to yield a bright red color. ADMA, (38.16 g of a 25 wt % solution in cyclohexane) and PPMA (28.5 grams of a 33% solution in cyclohexane) was added to the reaction flask the contents were stirred for two hours. A reaction aliquot was collected by cannulating the polymer mixture in oxygen-free methanol. The precipitated polymer was analyzed by GPC for Mn. DMAEMA monomer (1.32 g) was then added to the reaction flask and the contents were stirred for an additional 0.5 hour at −78° C. The reaction aliquot was then quenched in oxygen-free methanol. The reaction product was precipitated out in methanol to yield a powdery white precipitate which was vacuum-dried in an oven at 50° C. for eight hours to yield 20 grams of a dry polymer. The 1$^{st}$ block was analyzed by GPC yielding a Mn of 43 kg/mol and Mw/Mn=1.05.

Example 4

This example details the layer-by-layer growth using PDMAEMA-b-PtBMA of Example 1. This example details the application of three layers of the block copolymer on a photoresist substrate. A model anionic surface was prepared on a blank silicon wafer by coating a random copolymer of n-butylmethacrylate (40%) and methacrylic acid (60%) (P(nBMA-r-MAA)) in 4-methyl-2-pentanol (2 wt %) to give a film with thickness of 62 nm after a 90° C. soft bake. Process conditions for the steps and thickness results demonstrating sequential film growth are summarized in Table 1. For Step 1 (See Step 1, Process A1 in Table 1; See FIG. 1(B)), a n-butylacetate (nBA) solution of 1 wt % of the block copolymer, PDMAEMA-b-PtBMA was then overcoated on the film, baked at 110° C., and rinsed with nBA to remove excess material, and film thickness was recorded (See Step 1, Process A1 in Table 1—see FIG. 1(C)). To begin Step 2 (see FIG. 1(D)), the film stack was then coated with a 2 wt % isobutyl isobutyrate (IBIB) solution of p-toluenesulfonic acid (pTSA) (20 wt % of total solids) and a random copolymer of n-butylmethacrylate (25%) and isobutylmethacrylate (75%) (P(nBMA-r-iBMA) (80 wt % of total solids), the stack was then baked at 150° C., and the acid layer was removed by rinsing with IBIB, and thickness was again measured (See Process B1 in Table 1; See FIG. 1(E)). The nBA solution of PDMAEMA-b-PtBMA was again overcoated on the film, baked at 110° C., and rinsed with nBA to remove excess material, and film thickness was recorded (See Process A2 in Table 1; see FIG. 1(G)). This alternating process of acid treatment material (Process B) followed by block copolymer (Process A) was repeated once more to give three layers of film growth. This process gave 3.3 nm growth after Step 1, additional 7.3 nm growth after Step 2, and 5.7 nm further growth in Step 3, for a total film growth of 16.3 nm.

TABLE 1

|  | Original | Step 1 Process A1 | Treatment B1 | Step 2 Process A2 | Treatment B2 | Step 3 Process A3 |
|---|---|---|---|---|---|---|
| FT (nm) | 54.2 ± 0.1 | 57.5 ± 0.1 | 59.1 ± 0.2 | 64.9 ± 0.6 | 64.3 ± 0.4 | 70.7 ± 0.6 |
| ΔFT (nm) |  | 3.3 | 1.6 | 5.8 | −0.6 | 6.3 |
| Total FT Growth (nm) |  | 3.2 |  | 10.6 |  | 16.3 |
| Bake process | 90° C., 60 s | 110° C., 60 s | 130° C., 60 s | 110° C., 60 s | 130° C., 60 s | 110° C., 60 s |

Example 5

This example details layer-by-layer growth using PDMAEMA-b-PAdMA-b-PtBMA of Example 2. Process conditions for the steps and thickness results demonstrating sequential film growth are summarized in Table 2 below. This example details the application of three layers of the block copolymer on a photoresist substrate.

A model anionic surface was prepared on a blank silicon wafer by coating a random copolymer of n-butylmethacrylate (40%) and methacrylic acid (60%) (P(nBMA-r-MAA)) in 4-methyl-2-pentanol (2 wt %) to give a film with thickness of 62.2±0.2 nm after a 90° C. soft bake. For Step 1, an nBA solution of 1 wt % of the triblock copolymer, PDMAEMA-b-PAdMA-b-PtBMA was then overcoated on the film, baked at 110° C., and rinsed with nBA to remove excess material, and film thickness was recorded (Step 1, Process A1). To begin Step 2, the film stack was then coated with a 2 wt % IBIB solution of pTSA (20 wt % of total solids) and a random copolymer of n-butylmethacrylate (25%) and isobutylmethacrylate (75%) (P(nBMA-r-iBMA) (80 wt % of total solids), the stack was then baked at 150° C., and the acid layer was removed by rinsing with IBIB, and thickness was again measured (Process B1). The nBA solution of PDMAEMA-b-PAdMA-b-PtBMA was again overcoated on the film, baked at 110° C., and rinsed with nBA to remove excess material, and film thickness was recorded (Process A2). This alternating process of acid treatment material (Process B) followed by block copolymer (Process A) was repeated once more to give three layers of film growth. Process conditions for the steps and thickness results demonstrating sequential film growth are summarized in Table. This process gave 2.9 nm growth after Step 1, additional 3.4 nm growth after Step 2, and 4.7 nm further growth in Step 3, for a total film growth of 10.7 nm.

TABLE 2

|  | Step 1 | | Step 2 | | Step 3 | |
| --- | --- | --- | --- | --- | --- | --- |
|  | Original | Process A1 | Treatment B1 | Process A2 | Treatment B2 | Process A3 |
| FT (nm) | 62.2 ± 0.2 | 65.1 ± 0.3 | 64.8 ± 0.2 | 68.2 ± 0.3 | 68.2 ± 0.2 | 72.9 ± 0.6 |
| ΔFT (nm) |  | 2.9 | −0.3 | 3.4 | 0.0 | 4.7 |
| Total FT Growth (nm) |  | 2.9 |  | 6.0 |  | 10.7 |
| Bake process | 90° C., 60 s | 110° C., 60 s | 150° C., 60 s | 110° C., 60 s | 150° C., 60 s | 110° C., 60 s |

Example 6

This example details layer-by-layer growth using PDMAEMA-b-PAdMA-b-PtBMA of Example 2. Process conditions for the steps and thickness results demonstrating sequential film growth are summarized in Table 2 below. This example details the application of four layers of the block copolymer on a photoresist substrate.

A model NTD resist film surface was prepared on a blank silicon wafer by coating a random copolymer of n-butylmethacrylate (40%) and methacrylic acid (60%) (P(nBMA-r-MAA)) in 4-methyl-2-pentanol (2 wt %) to give a film with thickness of 53.7±0.2 nm after a 90° C. soft bake. For Step 1, an nBA solution of 1 wt % of a triblock copolymer, PDMAEMA-b-PAdMA-b-PtBMA, was then overcoated on the film, baked at 110° C., and rinsed with nBA to remove excess material, and film thickness was recorded (Step 1, Process A1). To begin Step 2, the film stack was then coated with a 2 wt % IBIB solution of pTSA (20 wt % of total solids) and a random copolymer of n-butylmethacrylate (25%) and isobutylmethacrylate (75%) (P(nBMA-r-iBMA) (80 wt % of total solids), the stack was then baked at 130° C., and the acid layer was removed by rinsing with IBIB, and thickness was again measured (Process B1). The nBA solution of PDMAEMA-b-PAdMA-b-PtBMA was again overcoated on the film, baked at 110° C., and rinsed with nBA to remove excess material, and film thickness was recorded (Process A1). This alternating process of acid treatment material (Process B) followed by block copolymer (Process A) was repeated twice more to give four layers of film growth. Process conditions for the steps and thickness results demonstrating sequential film growth are summarized in Table. As in the previous example, Step 1 resulted in 3 nm growth, and subsequent steps resulted in larger growth. Step 2 produced an additional 6.9 nm growth, Step 3 produced 7.9 nm, and Step 4 resulted in a final 8.9 nm growth, giving a total film growth of 31.9 nm after the four step process.

TABLE 3

|  | Step 1 | | Step 2 | | Step 3 | | Step 4 | |
| --- | --- | --- | --- | --- | --- | --- | --- | --- |
|  | Original | Process A1 | Treatment B1 | Process A2 | Treatment B2 | Process A3 | Treatment B3 | Process A4 |
| FT (nm) | 53.7 ± 0.2 | 56.7 ± 0.3 | 59.3 ± 0.3 | 66.1 ± 0.5 | 66.6 ± 0.5 | 74.4 ± 0.7 | 76.5 ± 0.9 | 85.4 ± 1.2 |
| ΔFT (nm) |  | 3.0 | 2.6 | 6.9 | 0.5 | 7.9 | 2.1 | 8.9 |
| Total FT Growth (nm) |  | 3.0 |  | 12.5 |  | 20.9 |  | 31.9 |
| Bake process | 90° C., 60 s | 110° C., 60 s | 130° C., 60 s | 110° C., 60 s | 130° C., 60 s | 110° C., 60 s | 130° C., 60 s | 110° C., 60 s |

Example 7

This example demonstrates formation of trench patterns in a negative tone developed photoresist.

Silicon wafers having line/space patterns were first prepared and processed as follows. Eight-inch silicon wafers having a bilayer stack of 220 Å silicon-containing antireflective coating (SiARC) layer over 1350 Å organic underlayer were provided. A photoresist composition detailed below was coated over the bilayer stack and soft baked at 90° C. for 60 seconds on a TEL CLEAN TRACK™ LITHIUS™ i+ coater/developer, to a target resist thickness of 1000 Å.

The photoresist was prepared from the following photoresist composition. 17.73 g Matrix Polymer B (15 wt % in PGMEA), 16.312 g PAG D solution (1 wt % in methyl-2-hydroxy isobutyrate), 3.463 g PAG B solution (1 wt % in PGMEA), 6.986 g PAGE solution (2 wt % in methyl-2-hydroxyisobutyrate), 4.185 g trioctylamine (1 wt % solution in PGMEA), 0.248 g Polymer Additive A (25 wt % solution in PGMEA), 25.63 g PGMEA, 9.69 g gamma-butyrolactone and 22.61 g methyl-2-hydroxyisobutyrate were mixed and filtered through a 0.2 μm Nylon filter.

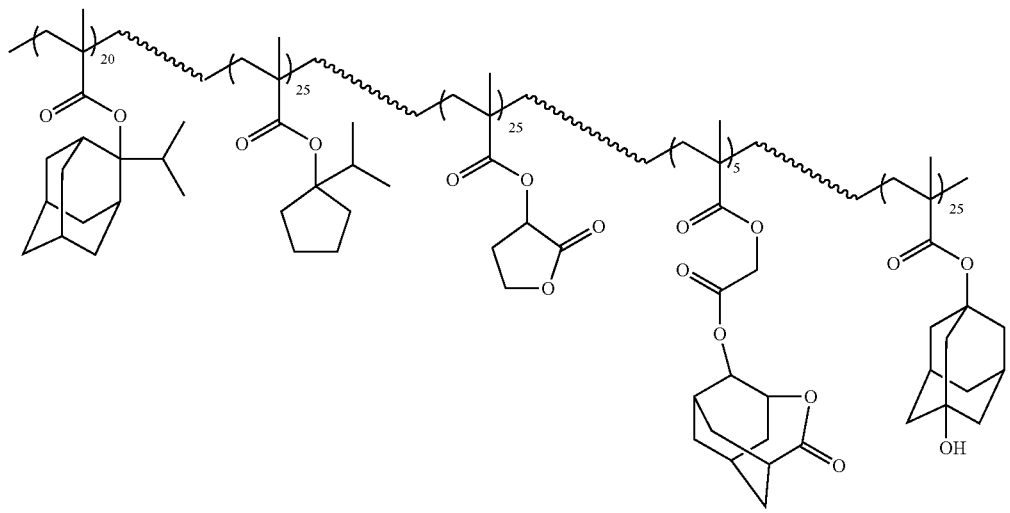

Matrix Polymer B

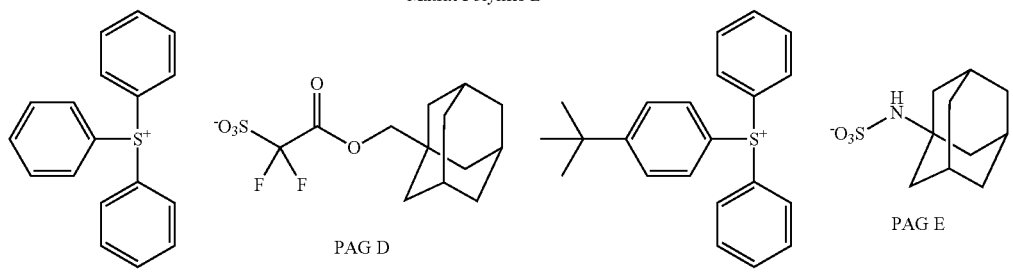

PAG D

PAG E

Figure 2B:
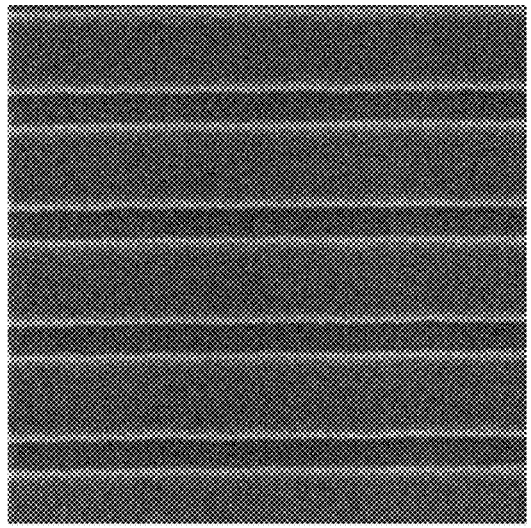
FIG. 2(B) shows top-down SEM images of line/space patterns after a shrink method from Example 8.
Figure 2A:
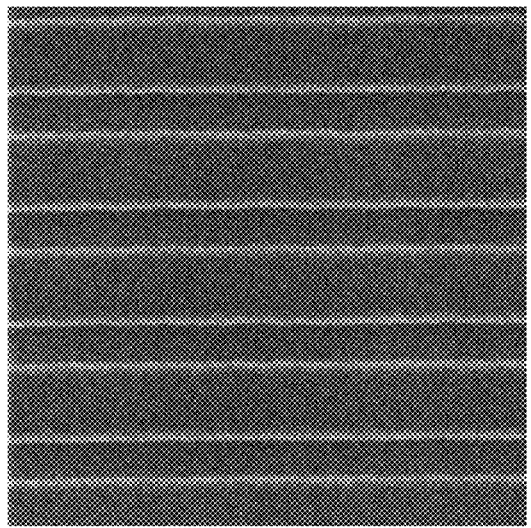
FIG. 2(A) shows top-down SEM images of line/space patterns before a shrink method from Example 7.

The photoresist layer was exposed using an ASML 1100 scanner with a numerical aperture (NA) of 0.75 and Dipole-35Y illumination through a reticle including line/space patterns with a pitch of 150 nm at various doses across each wafer. A post-exposure bake was performed at 90° C. for 60 seconds, and the photoresist layer was developed using an n-butylacetate (nBA) developer to form line/space patterns with a pitch of 150 nm and various critical dimensions (CDs) across the wafers. One of the resist-patterned wafers was observed by SEM as a control without further processing, and a representative SEM micrograph is shown in FIG. 2A The average spacing between lines ($CD_1$) was measured as 60 nm.

Example 8

This example demonstrates formation of shrinking of trench features by application of a block copolymer. A 2-heptanone solution of 1.5 wt % of PDMAEMA-b-P (AdMA-random-PPMA) from Example 3 and a 0.15 wt % of thermal acid generator triethylammonium paratoluenesulfonate was prepared and filtered through a 0.2 μm ultra-high molecular weight polyethylene (UPE) filter. Two wafers from Example 7 were overcoated with this solution by spin coating at 1500 rpm on a TEL CLEAN TRACK™ LITHIUS™ i+ coater/developer. The patterned wafers were soft baked at 60° C. for 60 seconds and rinsed with n-butylacetate on a spin-coater. One of the treated wafers was observed by SEM, and a representative SEM micrograph is shown in FIG. 2B. The average spacing between lines ($CD_2$) was measured at mid-height of the pattern, with $CD_2$=46 nm, and the average shrink amount $\Delta CD_a$, where $\Delta CD_a = CD_1 - CD_2$, was calculated, with $\Delta CD_a$=14 nm.

Example 9

This example demonstrates formation of shrinking of trench features by a multilayer electrolyte type application of a block copolymer. A 2-heptanone solution of 1.5 wt % of PDMAEMA-b-P(AdMA-random-PPMA) from Example 3 was prepared and filtered through a 0.2 μm ultra-high molecular weight polyethylene (UPE) filter. A wafer from Example 8 was baked at 140° C. for 60 seconds to induce partial deblocking of PPMA for carboxylic acid generation. The wafers were additionally overcoated with the block copolymer solution by spin coating at 1500 rpm on a TEL CLEAN TRACK™ LITHIUS™ i+ coater/developer. The patterned wafer was soft baked at 60° C. for 60 seconds and rinsed with n-butylacetate on a spin-coater. The resulting patterns were observed by SEM, and a representative SEM micrograph is shown in FIG. 2C. The average spacing between lines (CD3) was measured at mid-height of the pattern, with CD3=41 nm. The total average shrink amount $\Delta CD_b$, where $\Delta CD_b = CD_1 - CD_3$, was 19 nm, and the additional shrink amount from the second coating of the block copolymer, $\Delta\Delta CD$, where $\Delta\Delta CD = \Delta CD_b - \Delta CD_a$, was 5 nm.

What is claimed is:
1. A multi-layered article, comprising:
a substrate; and
two or more layers disposed over the substrate, wherein each said layer comprises a block copolymer comprising a first block and a second block, wherein the first block comprises a repeat unit containing a hydrogen acceptor or a hydrogen donor, and the second block comprises a repeat unit containing a hydrogen donor when the repeat unit of the first block contains a hydrogen acceptor, or a hydrogen acceptor when the repeat unit of the first block contains a hydrogen donor; wherein the first block of an innermost of said two or more layers is bonded to the substrate, and the first block of each layer disposed over the innermost layer is bonded to the second block of a respective underlying layer; and wherein the hydrogen donor or hydrogen acceptor of the second block of an outermost said two or more layers is blocked.

2. The multi-layered article of claim 1, wherein the two or more layers comprise a first layer and a second layer, wherein the first layer is the innermost layer and is bonded to the substrate, and the second layer is the outermost layer and is bonded to the first layer.

3. The multi-layered article of claim 1, wherein the repeat unit of the first block contains a hydrogen acceptor.

4. The multi-layered article of claim 3, wherein the repeat unit of the first block containing a hydrogen acceptor comprises a nitrogen-containing group.

5. The multi-layered article of claim 4, wherein the nitrogen-containing group is chosen from amine, amide and pyridine groups.

6. The multi-layered article of claim 1, wherein the repeat unit of the first block contains a hydrogen donor.

7. The multi-layered article of claim 1, wherein one or more of the block copolymers further comprises a block of a neutral polymer disposed between the first block and the second block.

8. The multi-layered article of claim 1, wherein the substrate is a semiconductor substrate.

9. The multi-layered article of claim 8, where the substrate comprises a photoresist pattern on which the two or more layers are disposed, wherein the first block of the block copolymer of the innermost layer is bonded to the photoresist pattern.

10. The multi-layered article of claim 9, wherein the photoresist pattern comprises carboxylic acid and/or hydroxyl groups on a surface thereof.

* * * * *